(12) United States Patent
Chengson et al.

(10) Patent No.: US 10,455,690 B1
(45) Date of Patent: Oct. 22, 2019

(54) GRID ARRAY PATTERN FOR CROSSTALK REDUCTION

(71) Applicant: Juniper Networks, Inc., Sunnyvale, CA (US)

(72) Inventors: David P. Chengson, Aptos, CA (US); Ranjeeth Doppalapudi, San Jose, CA (US)

(73) Assignee: Juniper Networks, Inc., Sunnyvale, CA (US)

( * ) Notice: Subject to any disclaimer, the term of this patent is extended or adjusted under 35 U.S.C. 154(b) by 0 days.

(21) Appl. No.: 15/934,813

(22) Filed: Mar. 23, 2018

Related U.S. Application Data

(60) Provisional application No. 62/477,636, filed on Mar. 28, 2017.

(51) Int. Cl.
| | |
|---|---|
| H05K 1/02 | (2006.01) |
| H05K 1/11 | (2006.01) |
| H05K 3/42 | (2006.01) |
| H05K 3/34 | (2006.01) |

(52) U.S. Cl.
CPC ......... *H05K 1/0228* (2013.01); *H05K 1/0245* (2013.01); *H05K 1/112* (2013.01); *H05K 3/3436* (2013.01); *H05K 3/429* (2013.01); *H05K 2201/10719* (2013.01); *H05K 2201/10734* (2013.01)

(58) Field of Classification Search
CPC ...... H05K 1/0228; H05K 1/0245; H05K 1/11; H05K 1/111; H05K 1/112; H05K 2201/10734; H05K 2201/10719; H05K 2201/097; H05K 2201/09263; H05K 2201/0979; H01L 23/49822; H01L 23/50; H01L 23/52; H01L 23/522; H01L 23/5221
See application file for complete search history.

(56) References Cited

U.S. PATENT DOCUMENTS

| | | | |
|---|---|---|---|
| 7,180,011 B1 * | 2/2007 | Hall | H01L 23/49822 174/255 |
| 9,089,060 B1 * | 7/2015 | Azeroual | H05K 1/114 |
| 2003/0183919 A1 * | 10/2003 | Devnani | H01L 23/49822 257/691 |
| 2004/0268271 A1 * | 12/2004 | Agrawal | H01L 23/49838 333/12 |

(Continued)

*Primary Examiner* — Roshn K Varghese
(74) *Attorney, Agent, or Firm* — Harrity & Harrity, LLP (57) ABSTRACT

A printed circuit board (PCB) assembly may include a component capable of sending or receiving high-speed differential signal pairs, a package that is connected to the component, and a PCB connected to the package. The PCB assembly may be used to support a first high-speed differential signal pair that includes a first differential signal and a second differential signal. The first differential signal may be capable of causing crosstalk onto a particular differential signal, of a second high-speed differential signal pair, while propagating through the PCB assembly. A set of interconnects may be used to intelligently route the first differential signal pair within the package and/or within the PCB. The set of interconnects may include a first interconnect to route the first differential signal away from the particular differential signal and a second interconnect to route the second differential signal toward the particular differential signal.

20 Claims, 5 Drawing Sheets

(56) References Cited

U.S. PATENT DOCUMENTS

| | | |
|---|---|---|
| 2006/0180917 A1* | 8/2006 | Djordjevic ........... H05K 1/0216 257/691 |
| 2006/0192282 A1 | 8/2006 | Suwa et al. |
| 2007/0097658 A1* | 5/2007 | Yang .................... H05K 1/0231 361/780 |
| 2007/0205498 A1* | 9/2007 | Djordjevic .............. H01P 3/081 257/698 |
| 2008/0238585 A1 | 10/2008 | Tokoro |
| 2008/0266019 A1 | 10/2008 | Fusayasu et al. |
| 2009/0289348 A1* | 11/2009 | Tang ....................... H01L 23/50 257/691 |
| 2012/0187564 A1* | 7/2012 | Tsuge ................ H01L 23/49822 257/773 |
| 2014/0014404 A1* | 1/2014 | Hinton .................... H01L 23/50 174/261 |
| 2014/0160707 A1 | 6/2014 | Zhang et al. |
| 2014/0264907 A1* | 9/2014 | Altunyurt ........... H01L 23/5226 257/774 |
| 2014/0300003 A1* | 10/2014 | Kariyazaki ....... H01L 23/49816 257/774 |

* cited by examiner

GRID ARRAY PATTERN FOR CROSSTALK REDUCTION

RELATED APPLICATION

This application claims priority under 35 U.S.C. § 119 to U.S. Provisional Patent Application No. 62/477,636, filed on Mar. 28, 2017, the content of which is incorporated by reference herein in its entirety.

BACKGROUND

A printed circuit board (PCB) assembly may include one or more components to facilitate transmitter and receiver signal routing for high speed data connections. For example, the PCB assembly may include a PCB, a grid array (GA) package, and an integrated circuit, wherein the high-speed signals travel to and from the integrated circuit by traveling through the PCB and the GA package. Additionally, high speed signals may carry information at rates of 25 Gigabits per second (Gbps) or greater, which may cause significant signal integrity disturbances as a result of reflection, crosstalk, and ground bounce. The signal integrity disturbances may result in reduced network performance.

SUMMARY

According to some possible implementations, a printed circuit board (PCB) may include a set of pads associated with facilitating a connection through a package and to a component. The set of pads may include a set of via pads and a set of grid array (GA) pads. The PCB may include a set of vias electrically connected to the set of via pads and to a set of layers that may be perpendicular to the set of vias. The set of vias may be used to support high-speed differential signal pairs and may be connected to one or more non-ground layers of the set of layers. The high-speed differential signal pairs may include a first high-speed differential signal pair. The first high-speed differential signal pair may include a first differential signal and a second differential signal. The first differential signal may be capable of causing crosstalk onto a particular differential signal, of a second high-speed differential signal pair, while propagating through the package. The PCB may include a set of interconnects that electrically connect the set of via pads to the set of GA pads. The set of interconnects may include a first interconnect to route the first differential signal away from the particular differential signal of the second high-speed differential signal pair, and a second interconnect to route the second differential signal toward the particular differential signal. The routed second differential signal may be capable of causing an amount of crosstalk onto the particular differential signal that is proportional to an amount of crosstalk that the first differential signal is capable of causing within the package.

According to some possible implementations, a printed circuit board (PCB) assembly may include a component capable of sending or receiving high-speed differential signal pairs, a package that is connected to the component, and a PCB connected to the package. A set of pads may be connected to the package or to the PCB to facilitate a connection between the PCB and the component. The set of pads may include a set of package via pads, a set of package grid array (GA) pads, a set of PCB via pads, and a set of PCB GA pads. The set of package via pads may be connected to a set of package vias and the set of PCB pads may be connected to a set of PCB vias. The set of package vias and the set of PCB vias may to be used to support high-speed differential signal pairs that include a first high-speed differential signal pair. The first high-speed differential signal pair may include a first differential signal and a second differential signal. The first differential signal may be capable of causing crosstalk onto a particular differential signal, of a second high-speed differential signal pair, while propagating through a particular package via, of the set of package vias. A set of interconnects may be used to connect package pads to package GA pads or may be used to connect PCB pads to PCB GA pads. The set of interconnects may include a first interconnect to route the first differential signal away from the particular differential signal, and may include a second interconnect to route the second differential signal toward the particular differential signal.

According to some possible implementations, a package may include a set of pads associated with facilitating a connection between a printed circuit board (PCB) and one or more components. The set of pads may include a set of via pads and a set of grid array (GA) pads. A set of vias may be electrically connected to the set of via pads and to a set of layers that are perpendicular to the set of vias. The set of vias may be used to support high-speed differential signal pairs and may be connected to one or more non-ground layers of the set of layers. The high-speed differential signal pairs may include a first high-speed differential signal pair that includes a first differential signal and a second differential signal. The first differential signal may be capable of causing crosstalk onto a particular differential signal, of a second high-speed differential signal pair, while propagating through a particular via, of the set of vias. A set of interconnects may electrically connect the set of via pads to the set of GA pads. The set of interconnects may include a first interconnect to route the first differential signal away from the particular differential signal, and a second interconnect to route the second differential signal toward the particular differential signal. The first interconnect may traverse through a non-ground layer and the second interconnect may traverse through a different non-ground layer.

DETAILED DESCRIPTION

The following detailed description of example implementations refers to the accompanying drawings. The same reference numbers in different drawings may identify the same or similar elements.

A printed circuit board (PCB) assembly may include one or more components to facilitate transmitter and receiver signal routing for high speed data connections. For example, the PCB assembly may include a PCB, a package, and an integrated circuit, wherein high-speed signals travel to and from the integrated circuit by traveling through the PCB and the package. The package may include a grid array (GA), such as a ball grid array (BGA), which is an array of solder balls that are used to conduct electrical signals between the integrated circuit and the PCB on which the integrated circuit is placed.

The PCB may include one or more material layers that mechanically support and electrically connect electronic components using conductive pathways. The conductive pathways may be etched from copper sheets laminated onto a non-conductive substrate. The pathways may be organized as a number of layers on the PCB in order to increase the signal transmission density of the PCB.

PCBs may be used in high frequency applications. For example, a PCB may be populated with an integrated circuit used to enable high speed serial links (e.g., speeds at or above 56 gigabytes per second (Gbps))) to and from the PCB, as may be utilized for an Ethernet switch, a serializer/deserializer (SerDes), and/or the like. In this case, use of higher speed serial links may cause a significant increase in signal integrity disturbances, such as crosstalk. One type of crosstalk, far end crosstalk (FEXT), may occur when a first signal (referred to as a crosstalk aggressor signal) causes crosstalk onto a second signal (referred to as a crosstalk victim signal), wherein the signal propagation of the crosstalk aggressor signal and the crosstalk victim signal are traveling in the same direction.

In some cases, differential signaling may be used in a high speed application. For example, a differential signal pair may include two complimentary signals (e.g. a positive signal and a negative signal), and the two complimentary signals may be routed through the PCB assembly. Additionally, the differential signal pair may cause FEXT on a neighboring signal (e.g., a signal traveling within a threshold distance of the differential signal pair), in which case one of the differential signals may be a crosstalk aggressor signal and the neighboring signal may be a crosstalk victim signal.

Additionally, FEXT may be reduced by separating a distance between the crosstalk aggressor signal and the crosstalk victim signal using one or more ground vias (i.e., vias that are connected to a ground layer). For example, by adding a ground via between vias that support the crosstalk aggressor signal and the crosstalk victim signal, the signals may be far enough apart to reduce or eliminate FEXT.

However, as speeds of the serial links increase, the amount of FEXT between a crosstalk aggressor signal and a crosstalk victim signal may correspondingly increase. In this case, the distance between the crosstalk aggressor signal and the crosstalk victim signal may need to be increased to offset the increase in FEXT. One solution is to increase the number of ground vias between the vias that support the signals. Increasing the number of ground vias on the PCB reduces a number of vias available for sending and/or receiving signals, thereby reducing potential throughout of the PCB.

Some implementations described herein provide a GA space design pattern to be implemented on one or more parts of a PCB assembly to reduce or eliminate FEXT by enabling crosstalk (e.g., FEXT) cancellation. For example, a PCB assembly may include a PCB that is connected to a package, and the package may be connected to a component (e.g., an integrated circuit). In this case, the PCB assembly may be used to route high-speed differential signal pairs to and from the component.

As an example to illustrate routing through the PCB assembly, a first high-speed differential signal pair may be routed from a first part of the component (e.g., a transmitter part) to a second part of the component (e.g., a receiver part). In this example, a first differential signal of the first high-speed differential signal pair may be routed from the first part of the component, through a first package via (e.g., toward the PCB), through a GA space between the package and the PCB, through a first PCB via (e.g., toward a bottom portion of the PCB), through a non-ground layer of the PCB to a second PCB via, through the second PCB via of the PCB (e.g., toward a top portion of the PCB), through a second package via (e.g., toward the component), and may end at the second part of the component.

In some cases, the first differential signal of the first high-speed differential signal pair (referred to as a FEXT aggressor signal) may cause increasing amounts of FEXT onto a differential signal of a second high-speed differential signal pair (referred to as a FEXT victim signal). For example, the first high-speed differential signal pair may propagate through package vias at a same time and in a same direction as the second high-speed differential signal pair. Additionally, the package vias used to propagate the first differential signal pair and package vias used to propagate the second differential signal pair may be within close physical proximity of each other. As such, the FEXT aggressor signal may cause an increasing amount of FEXT onto the FEXT victim signal as the signals propagate through respective package vias.

To eliminate or reduce crosstalk such as FEXT, a GA space design pattern may be implemented on the package, on the PCB, or on a combination of the package and the PCB, to enable FEXT cancellation. For example, because the FEXT victim signal incurs an increasing amount of FEXT while propagating through the package via, a GA space design pattern may be used to cause a decreasing amount of FEXT in the PCB, such that the decrease in the amount of FEXT in the PCB offsets the increase in the amount of FEXT in the package, thereby reducing or eliminating FEXT via FEXT cancellation. As an example, the GA space design pattern may use a first interconnect to route the FEXT aggressor signal (i.e., the first differential signal of the first high-speed differential signal) away from the FEXT victim signal and may use a second interconnect to route a second differential signal, of the first high-speed differential signal, toward the FEXT victim signal. This may cause the second differential signal to become the FEXT aggressor signal during signal propagation within the PCB, and allows for FEXT cancellation because the second high-speed differential signal has a polarity that is opposite to that of the first high-speed differential signal.

Additionally, to achieve FEXT cancellation between FEXT within the package and FEXT within the PCB, the GA space design pattern may need to delay match the first high-speed differential signal pair. The first high-speed differential signal pair may be delay matched when the first differential signal propagates at a same rate as the second differential signal, such that the two differential signals travel from a first location to a second location in approximately the same time period. To delay match the first high-speed differential signal pair, the GA space design may design the first interconnect and the second interconnect to be of lengths that ensure delay matching, where the lengths may be based on differences in package via length versus PCB via length, differences in package via diameter versus PCB via diameter, differences in velocity of propagation of signals within different layers of the package and/or PCB, and/or the like.

In this way, the GA space design pattern enables FEXT cancellation to reduce or eliminate FEXT. Additionally, the GA space design pattern improves cross-sectional bandwidth of the PCB and/or the package, increases signal density, and/or improves throughput of the PCB assembly by reducing a number of ground vias that need to be placed between vias that support actual traffic to and from the component.

Figure 1A:
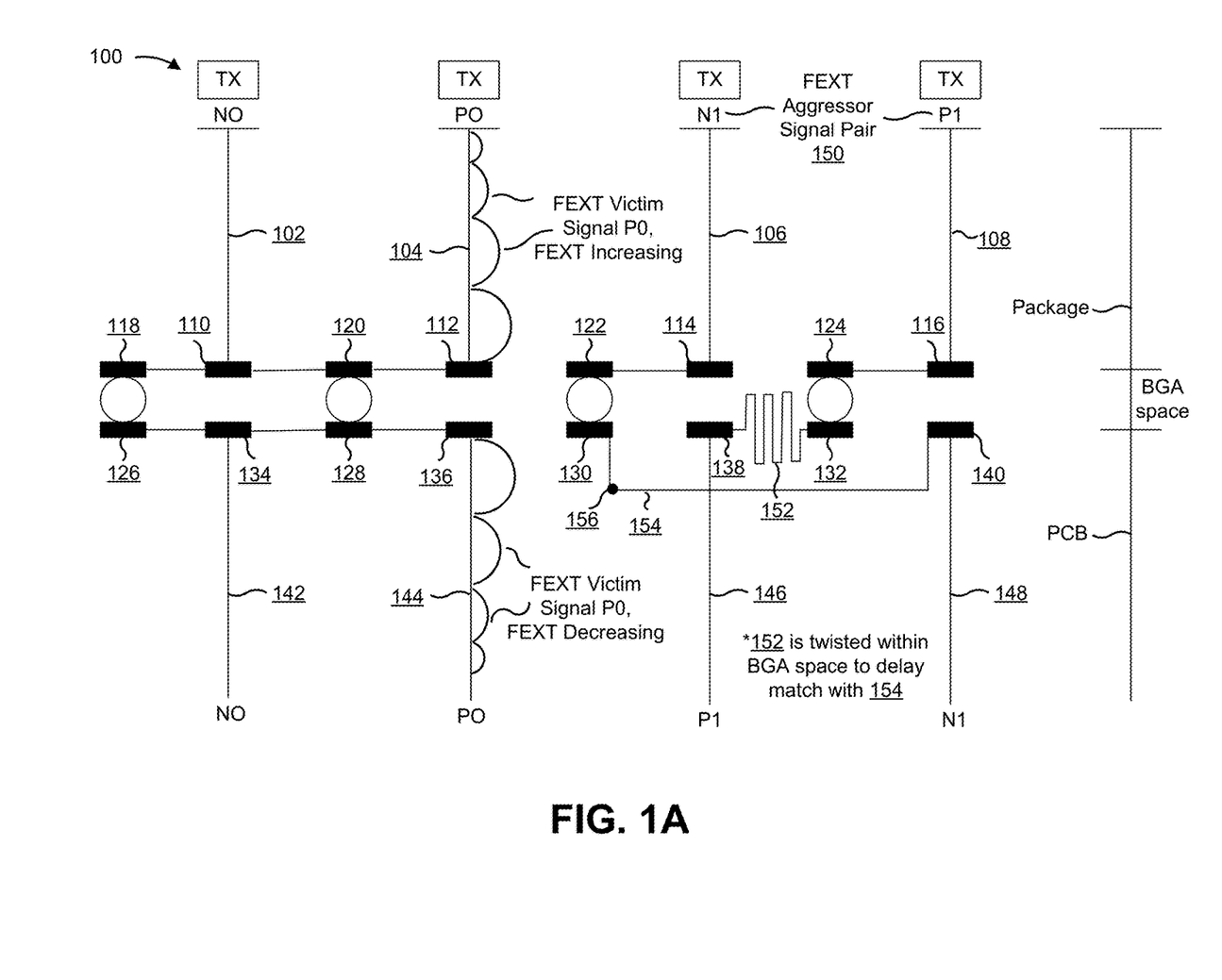
FIGS. 1A-1C are diagrams of an overview of an example apparatus described herein.
Figure 1B:
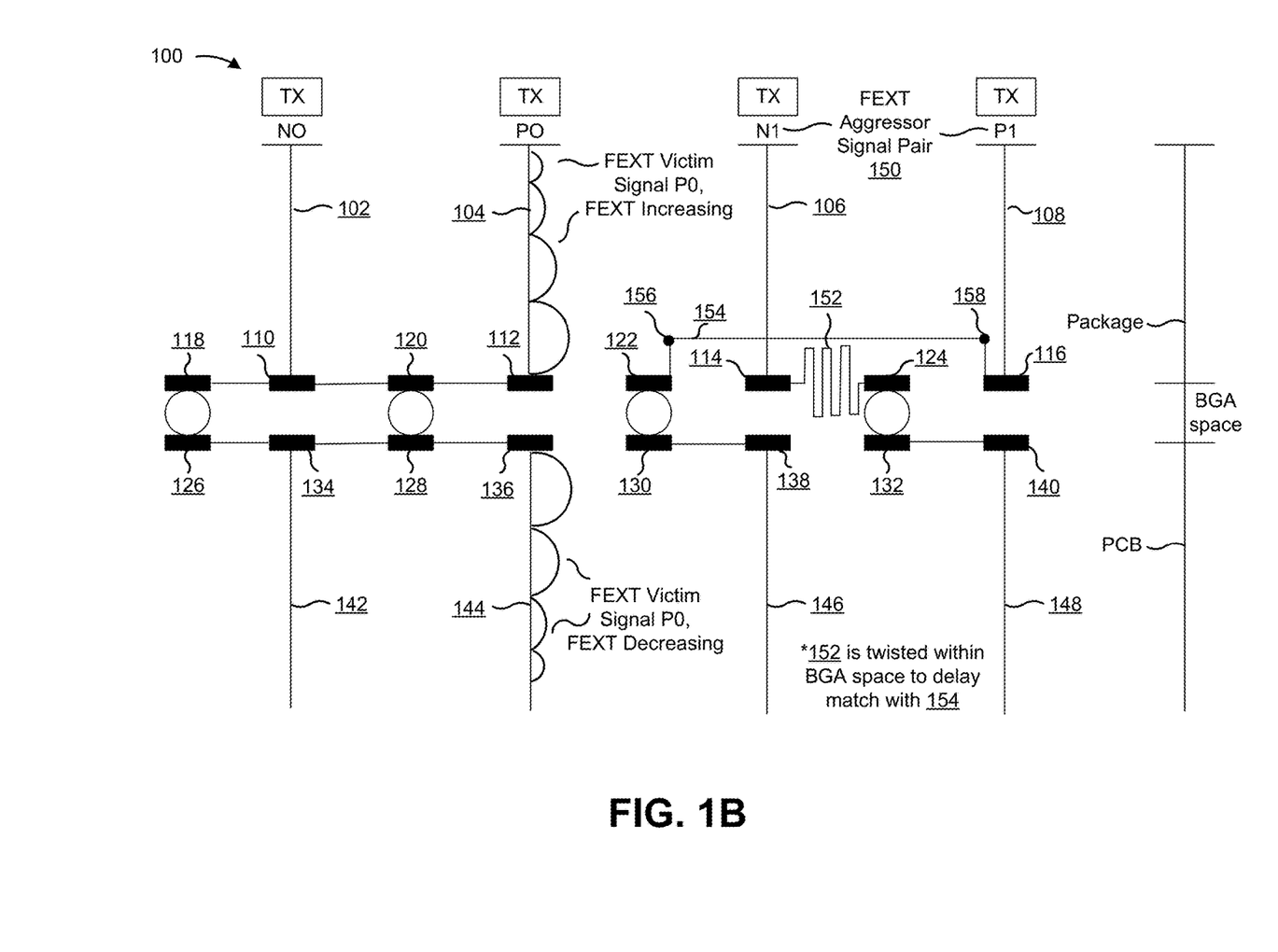
Figure 1C:
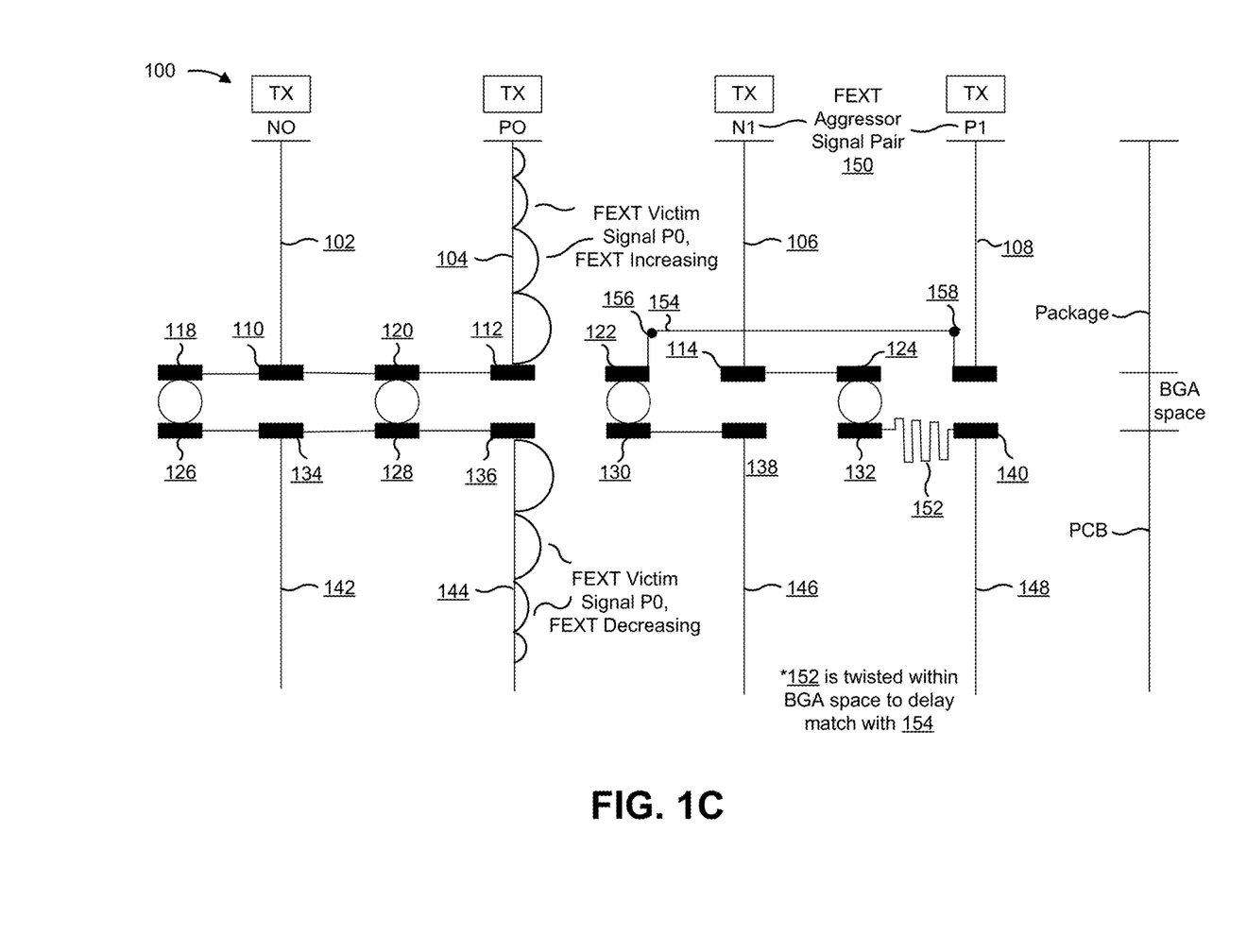

FIGS. 1A-1C are diagrams of an overview of a grid array (GA) GA design pattern implemented on an example apparatus 100 described herein. FIGS. 1A-1C show GA space design pattern that enables FEXT cancellation (e.g., partial FEXT cancellation, complete FEXT cancellation, etc.).

As shown in FIG. 1A, the GA space design pattern may be implemented on a printed circuit board (PCB) that is part of a PCB assembly. As shown in FIG. 1B, the GA space design pattern may be implemented on a package that is part of the PCB assembly. As shown in FIG. 1C, the GA space design pattern may be implemented on a combination of the PCB and the package.

As shown in FIG. 1A, the PCB assembly may include a package with a set of package vias (shown as package via 102, package via 104, package via 106, and package via 108) that are attached to a set of package via pads (shown as package via pad 110, package via pad 112, package via pad 114, and package via pad 116). Furthermore, the package may include a set of package grid array (GA) pads (shown as package GA pad 118, package GA pad 120, package GA pad 122, and package GA pad 124), such as package ball grid array (BGA) pads that are attached to a set of solder balls that are used to connect the package to a PCB.

Additionally, the PCB may include a set of PCB GA pads (shown as PCB GA pad 126, PCB GA pad 128, PCB GA pad 130, and PCB GA pad 132), such as a set of PCB BGA pads. Furthermore, the PCB may include a set of PCB via pads (shown as PCB via pad 134, PCB via pad 136, PCB via pad 138, and PCB via pad 140) that are attached to a set of PCB vias (shown as PCB via 142, PCB via 144, PCB via 146, and PCB via 148).

Additionally, the PCB assembly may be used to route high-speed differential signal pairs to and from a component. In some cases, high-speed differential signal pairs may serve as FEXT aggressor signal pairs and may cause crosstalk, such as FEXT, onto a differential signal of another high-speed differential signal pair.

As shown as an example, FEXT aggressor signal pair 150 may include a first FEXT aggressor signal with a negative polarity (N1) and a second FEXT aggressor signal with a positive polarity (P1). To illustrate signal propagation of the FEXT aggressor signal pair, the first FEXT aggressor signal (N1) may propagate through package via 106, through package via pad 114, through package GA pad 122, through a solder ball connected to package GA pad 122, through PCB GA pad 130, through interconnect 154 (via laser microvia 156), through PCB via pad 140, and through PCB via 148. Additionally, the second FEXT aggressor signal (P1) may propagate through package via 108, through package via pad 116, through package GA pad 124, through a solder ball connected to package GA pad 124, through PCB GA pad 132, through interconnect 152, through PCB via pad 138, and through PCB via 146.

As shown, interconnect 152 and interconnect 154 may be designed in a manner that enables FEXT cancellation. For example, even if the first FEXT aggressor signal (N1) causes increased amounts of FEXT onto the FEXT victim signal (P0) while propagating through package via 106, interconnect 154 may be designed to route the first FEXT aggressor signal (N1) away from the FEXT victim signal (P0), and interconnect 152 may be designed to route the second FEXT aggressor signal (P1) toward the FEXT victim signal. In this case, interconnect 154 may route the first FEXT aggressor signal to PCB via 148, and interconnect 152 may route the second FEXT aggressor signal to PCB via 146, thereby enabling the second FEXT aggressor signal (P1) to cause a decreasing amount of FEXT onto the FEXT victim signal (P0) while propagating through PCB via 146.

Additionally, interconnect 152 and interconnect 154 may be designed to connect PCB GA pads to PCB via pads at different layers of the PCB. For example, the PCB may include a set of layers that are perpendicular to the set of PCB vias. In this case, interconnect 152 and interconnect 154 may be designed to connect PCB GA pads to PCB via pads at different layers to avoid causing a short circuit. This is illustrated by interconnect 152 connecting PCB GA pad 132 to PCB via pad 138 at a first layer (e.g., layer 1 of the PCB) and by interconnect 154 connecting PCB GA pad 130 to PCB via pad 140 at another layer (e.g., layer 3 of the PCB). Additionally, to connect interconnect 154 from PCB GA pad 130 to PCB via pad 140 through the other layer, interconnect 154 may have to traverse through one or more microvias (shown as laser microvia 156). In this way, interconnect 152 and interconnect 154 enable FEXT cancellation without risk of FEXT aggressor signal pair 150 causing a short circuit.

In some implementations, to ensure that an accurate amount of FEXT cancellation occurs, the GA space design pattern may include lengths for interconnect 152 and/or interconnect 154 that ensure that the FEXT aggressor signals are delay matched. For example, assume a time needed for the FEXT aggressor signals to propagate through package vias is equal to a time needed for the FEXT aggressor signals to propagate through PCB vias. In this case, a length of interconnect 152 and a length of interconnect 154 may ensure proper delay matching by being equal.

In some cases, the GA space design pattern may include lengths for interconnect 152 and/or interconnect 154 that are based on a number of different factors that influence delay matching. For example, the GA space design pattern may include lengths of interconnect 152 and interconnect 154 that offset a difference in a total distance that the first FEXT aggressor signal (N1) and the second FEXT aggressor signal (P1) propagate through the package in relation to a total distance that the first FEXT aggressor signal (N1) and the second FEXT aggressor signal (P1) propagate through the PCB.

As an example, assume PCB via 146 and PCB via 148 are longer than package via 106 and package via 108. If interconnect 152 and interconnect 154 were of equal length, the second FEXT aggressor signal would travel through PCB via 146 for a longer distance than the first FEXT aggressor signal would travel through package via 106. This would cause the decreases in FEXT from the second FEXT aggressor signal to exceed the FEXT increases caused by first FEXT aggressor signal (which may cause FEXT in an opposite direction). Instead, the GA space design pattern may include a length of interconnect 152 that is longer than a length of interconnect 154, thereby ensuring that the FEXT aggressor signal pair is delay matched.

Additionally, or alternatively, the GA space design pattern may include lengths of interconnect 152 and interconnect 154 that offset a difference between package via diameter and PCB via diameter. For example, if package vias and PCB vias have different diameters, FEXT aggressor signals traveling through the package vias and the PCB vias may have different velocity of propagation speeds. As an example, if package vias have larger diameters than PCB vias, and interconnect 152 and interconnect 154 are of equal length, the FEXT aggressor signal pairs may not delay match. Instead, either interconnect 152 or interconnect 154 may be designed to be longer than the other to offset a difference between package via diameter and PCB via diameter.

Additionally, or alternatively, the GA space design pattern may include lengths of interconnect 152 and interconnect 154 that offset a difference in a velocity of propagation of FEXT aggressor signals while propagating through interconnect 152 and interconnect 154. For example, different layers of the PCB may use different transmission lines (e.g., microstrip, stripline, and/or the like) that have different velocities of propagation. Because interconnect 152 and interconnect 154 are located at different layers to prevent a short circuit, the differential signals propagating through interconnect 152 and interconnect 154 may propagate at different velocities. To offset this, the GA space design pattern may include interconnect 152 and interconnect 154 such that an interconnect located at a layer with a faster velocity of propagation is longer than an interconnect located at a layer with a slower velocity of propagation.

In some implementations, the PCB assembly may be designed with one or more ground vias between the FEXT aggressor signal pair and the FEXT victim signal. For example, depending on a differential signal speed (e.g., 112 gigabytes per second (Gbps), 224 Gbps, etc.), ground vias may need to be implemented in addition to the above-described GA space design pattern to ensure that FEXT is reduced or eliminated. However, it is to be noted that a number of ground vias that would be used in conjunction with the GA space design pattern will always be less than a number of ground vias that would be used if the GA space design pattern was not implemented, thereby improving cross-sectional bandwidth of the PCB and/or the package relative to a conventional architecture of a PCB assembly (e.g., that does not utilize the GA space design pattern).

By designing interconnect 154 to route the first FEXT aggressor signal away from the FEXT victim signal, by designing interconnect 152 to route the second FEXT aggressor signal toward the FEXT victim signal, and by designing interconnect 152 and interconnect 154 in a manner that delay matches the FEXT aggressor signals, the GA space design pattern is able to enable FEXT cancellation. Furthermore, enabling FEXT cancellation reduces a number of ground vias that need to be placed between vias that support actual traffic to and from the component, thereby improving cross-sectional bandwidth of the PCB and/or the package, increasing signal density, improving throughput of the PCB assembly, and/or the like.

As shown in FIG. 1B, the GA space design pattern may be implemented on the package. For example, rather than place interconnect 152 and interconnect 154 within the PCB (as shown in FIG. 1A), the GA space design pattern may be implemented on the package.

To illustrate signal propagation of the FEXT aggressor signal pair, the first FEXT aggressor signal (N1) may propagate through package via 106, through package via pad 114, through interconnect 152, through package GA pad 124 (e.g., a package ball grid array (BGA) pad), through a solder ball connected to package GA pad 124, through PCB GA pad 132 (e.g., a PCB BGA pad), through PCB via pad 140, and through PCB via 148. Additionally, the second FEXT aggressor signal (P1) may propagate through package via 108, through package via pad 116, through interconnect 154 (via laser microvia 158 and laser microvia 156), through package GA pad 122, through a solder ball that connects to package GA pad 122, through PCB GA pad 130, through PCB via pad 138, and through PCB via 146.

As shown, the GA space design pattern may include a structure for interconnect 152 and interconnect 154 that enables FEXT cancellation, in a same manner described above. Additionally, the GA space design pattern may include lengths for interconnect 152 and interconnect 154 that are based on a number of different factors that influence delay matching, as each described above.

In this way, the GA space design pattern may enable FEXT cancellation. Furthermore, enabling FEXT cancellation reduces a number of ground vias that need to be placed between vias that support actual traffic to and from the component, thereby improving cross-sectional bandwidth of the package and/or the PCB, increasing signal density, improving throughput of the PCB assembly, and/or the like.

As shown in FIG. 1C, the GA space design pattern may be implemented on a combination of the PCB and the package. For example, rather than place interconnect 152 and interconnect 154 on the PCB, or rather than place interconnect 152 and interconnect 154 on the package, the GA design pattern may be implemented to place either interconnect 152 or interconnect 154 on the PCB and either interconnect 154 or interconnect 152 on the package.

In some cases, as shown, interconnect 152 may be implemented on the package and interconnect 154 may be implemented on the PCB. To illustrate signal propagation of the FEXT aggressor signal pair, the first FEXT aggressor signal (N1) may propagate through package via 106, through package via pad 114, through package GA pad 124 (e.g., a package ball grid array (BGA) pad), through a solder ball connected to package GA pad 124, through PCB GA pad 132 (e.g., a PCB BGA pad), through interconnect 152, through PCB via pad 140, and through PCB via 148. Additionally, the second FEXT aggressor signal (P1) may propagate through package via 108, through package via pad 116, through interconnect 154, through package GA pad 122, through a solder ball connected to package GA pad 122, through PCB GA pad 130, through PCB via pad 138, and through PCB via 146. In other cases, interconnect 152 may be implemented on the PCB and interconnect 154 may be implemented on the package, and signal propagation may occur in a similar manner.

As shown, the GA space design pattern may include a structure for interconnect 152 and interconnect 154 that enables FEXT cancellation, in a similar manner as described above. Additionally, the GA space design pattern may include lengths for interconnect 152 and interconnect 154 that are based on a number of different factors that influence delay matching, as each described above.

In this way, the GA space design pattern may enable FEXT cancellation. Furthermore, enabling FEXT cancellation reduces a number of ground vias that need to be placed between vias that support actual traffic to and from the component, thereby improving cross-sectional bandwidth of the package and/or the PCB, increasing signal density, improving throughput of the PCB assembly, and/or the like.

As indicated above, FIGS. 1A-1C are provided merely as an example. Other examples are possible and may differ from what was described with regard to FIGS. 1A-1C. For example, there may be additional elements of apparatus 100, fewer elements of apparatus 100, different elements of apparatus 100, or differently arranged elements of apparatus 100 than those shown in FIGS. 1A-1C. An element may be a via, a pad, a solder ball, a solder bump, and/or any other hardware included within the package and/or the PCB. Furthermore, two or more elements shown in FIGS. 1A-1C may be implemented within a single element, or a single element shown in FIGS. 1A-1C may be implemented as multiple, distributed elements. Additionally, or alternatively, elements of example apparatus 100 may perform one or more functions described as being performed by other elements of example apparatus 100.

Figure 2:
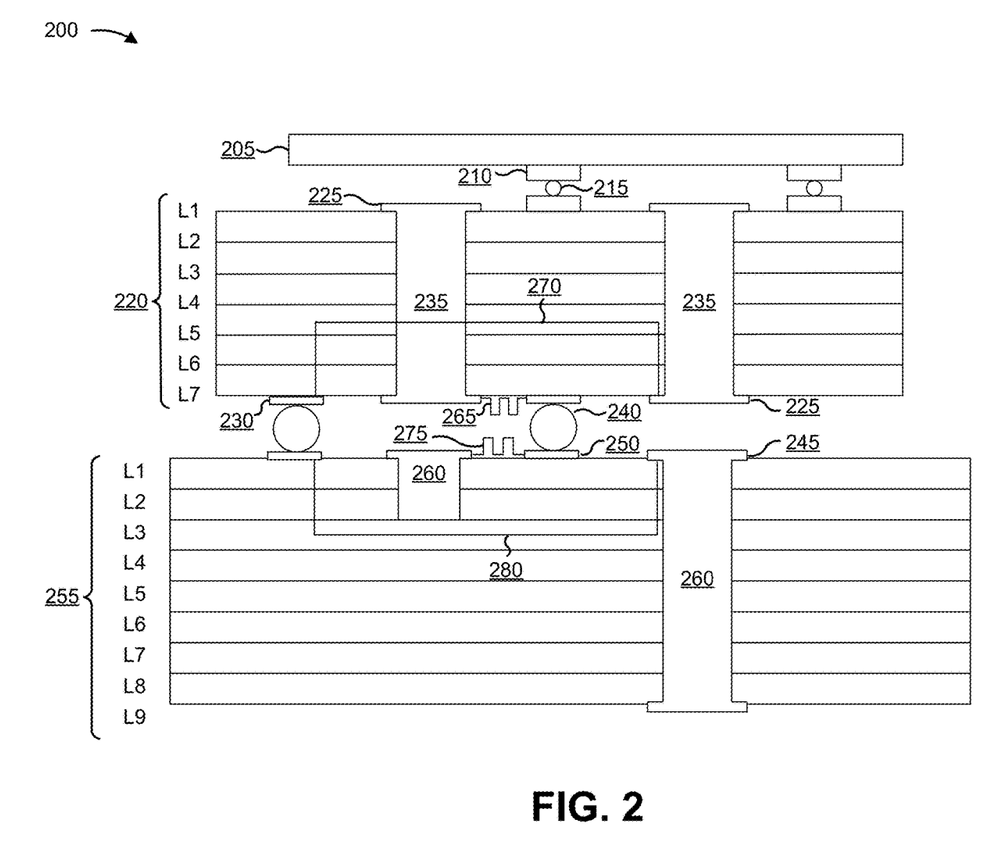
FIG. 2 is a diagram of an example printed circuit board (PCB) assembly.

FIG. 2 is a diagram of an example apparatus 200 that includes a component 205, a set of component pads 210, a set of solder bumps 215, a package 220, a set of package via pads 225, a set of package grid array (GA) pads 230 (e.g., package ball grid array (BGA) pads, package land grid array (LGA) pads, and/or the like), a set of package vias 235, a set of solder balls 240, a set of PCB via pads 245, a set of PCB GA pads 250 (e.g., PCB BGA pads, PCB LGA pads, and/or the like), a PCB 255, a set of PCB vias 260, a set of interconnects (e.g., interconnect 265, interconnect 270, interconnect, 275, interconnect 280, and/or the like), and/or the like.

In some implementations, component 205 may include a serializer/deserializer (SerDes) application-specific integrated circuit (ASIC), a field programmable gate array (FPGA), a bus, a power supply, an integrated circuit, an optical module, and/or the like.

In some implementations, package 220 may include a substrate (e.g., a non-conductive substrate) that includes mechanical support for component 205. In some implementations, PCB 255 may include a substrate that includes mechanical support for package 220. Additionally, or alternatively, package 220 and/or PCB 255 may include electrical connections for component 205 using, for example, component pads 210, package via pads 225, package GA pads 230, package vias 235, solder balls 240, PCB via pads 245, PCB GA pads 250, and/or PCB vias 260, conductive traces, and/or other features etched from laminated sheets (e.g., copper sheets or sheets made from another conductive material).

In some implementations, package 220 may include multiple layers, and conductors on different layers may be connected with package vias 235. In some implementations, PCB 255 may include multiple layers, and conductors on different layers may be connected with PCB vias 260.

In some implementations, package via 235 may provide an electrical connection between different layers and/or surfaces of package 220. For example, package via 235 may include a hole, in package 220, that is plated with a conductive material to provide the electrical connection. While FIG. 2 depicts two package vias 235 of the same length, it is to be understood that other implementations include package vias 235 that extend to particular layers of package 220 and/or include different lengths. In some implementations, PCB via 260 may provide an electrical connection between different layers and/or surfaces of PCB 255. For example, PCB via 260 may include a hole, in PCB 255, that is plated with a conductive material to provide the electrical connection.

In some implementations, package vias 235 and/or PCB vias 260 may serve as, for example, a transmitter (TX) via, a receiver (RX) via, and/or a ground via, as described below. A TX via may serve as a package via 235 and/or a PCB via 260 used for transmission of a signal output by component 205. In some implementations, package 220 and/or PCB 255 may include a pair of TX vias used to carry a differential signal pair (e.g., a positive signal and a negative signal) transmitted by component 205 (e.g., for differential signaling). In some implementations, an RX via may serve as a package via 235 and/or a PCB via 260 used for reception of a signal to be received by component 205. In some implementations, package 220 and/or PCB 255 may include a pair of RX vias used to carry a differential signal pair to be received by component 205. In some implementations, a ground via may serve as a package via 235 and/or a PCB via 260 used for electrical grounding of component 205. In some implementations, a ground via may be used to carry a ground signal to component 205, may be used to provide a ground connection for power, and/or the like.

In some cases, PCB 255 may support multiple packages 220 and/or multiple components 205. For example, PCB 255 may connect to multiple packages 220 and/or multiple components 205 to allow signals to be routed from one component 205 to one or more additional components 205. As an example, a transmitter signal (or transmitter signals in the case of a differential signal pair) may be routed from a first component 205, through a package via 235 of a first package 220, through a first PCB via 260 (which may extend one or more layers below a first layer), through a layer connected to a bottom portion of the first PCB via 260, to one or more additional PCB vias 260. Additionally, the transmitter signal may be routed upward through another PCB via 260 (e.g., a PCB via 260 that may be used to reach a second component 205), through a package via 235 of a second package 220, and to the second component 205. In other cases, a package 220 may support multiple components 205.

In some implementations, package via 235 and/or PCB via 260 may include, at each layer of package 220 and/or PCB 255, a pad that provides electrical connections between copper traces on the layer or an anti-pad that defines a non-conductive "void" around the package via 235 and/or PCB via 260 to insulate the package via 235 and/or PCB via 260 from that layer.

A number of example layers are shown in association with package 220 (e.g., "L1-L7") and in association with PCB 255 (e.g., "L1-L9"). Each layer may include conductive traces (e.g., copper traces) that route power, signal, and/or ground communication paths through package 220 and/or PCB 255. Each layer may be generally electrically isolated from one another, and may be potentially connected through package vias 235 or PCB vias 260. In some implementations, a layer may be a power layer or a ground layer. For example, PCB 255 may include an alternating pattern of ground layers and power layers.

In some implementations, and as shown in FIG. 2, PCB vias 260 may extend to different layers of PCB 255. For example, as shown in FIG. 2, a first via 260 may extend from a first layer (e.g., "L1") to a second layer (e.g., "L3"), and a second via may extend from the first layer (e.g., "L1") to a ninth layer (e.g., "L9").

In some implementations, different package vias 235 and/or PCB vias 260 may be different types of vias. For example, package via 235 and/or PCB via 260 may be a laser drilled microvia, a short plated-through hole via, a stacked microvia, a skip via, and/or the like. In some implementations, particular fabrication techniques may be used to extend a package via 235 to a particular layer of package 220 and/or a PCB via 260 to a particular layer of PCB 255 (e.g., a backdrilling technique, a stacking technique, etc.).

In some implementations, solder ball 240 may include a mounting mechanism for mounting package 220 to PCB 255. Additionally, or alternatively, solder bump 215 may include a mounting mechanism for mounting component 205 to package 220. In some implementations, package 220 may be mounted to the PCB 255 using the set of solder balls 240 (e.g., by heating the set of solder balls 240 and causing the set of solder balls 240 to melt). In some implementations, the set of solder balls 240 may be arranged in a grid array (GA). In this case, multiple PCB vias 260 may be arranged in an array (e.g., an array of PCB vias 260) according to the GA pattern of solder balls 240 (e.g., to provide electrical connectivity for package 220 mounted to PCB 255).

A set of solder balls 240 is an example of a mounting mechanism that may be used to mount package 220 to PCB 255. Additionally, a set of solder bumps 215 is an example of a mounting mechanism that may be used to mount component 205 to package 220.

In some implementations, other mounting mechanisms may be used, such as a surface-mount technology (SMT) mechanism (e.g., one or more pins, a pin grid array, one or more leads, one or more flat contacts, and/or the like), a through-hole technology (e.g., one or more leads on the integrated circuit may be inserted into PCB vias 260), a land grid array (LGA) (i.e., a flat surface contact with no solder balls), and/or the like.

In some implementations, a set of interconnects may be used as part of a GA space design pattern. For example, interconnect 265 and interconnect 270 may be used as part of a GA space design pattern that is located within package 220 and enables FEXT cancellation between package 220 and PCB 255, as described elsewhere herein. As another example, interconnect 275 and interconnect 280 may be used as part of GA space design pattern that is located within PCB 255 and enables FEXT cancellation between package 220 and PCB 255, as described elsewhere herein. As another example, a combination of interconnects (e.g., interconnect 265 and interconnect 280, interconnect 275 and interconnect 270, etc.) may be used as part of a GA space design pattern that is located both in package 220 and PCB 255 and enables FEXT cancellation between package 220 and PCB 255, as described elsewhere herein.

While FIG. 2 includes a particular number of package vias 235 and/or PCB vias 260, it should be understood that other implementations include different numbers of package vias 235 and/or PCB vias 260 that extend to and/or from different layers of package 220 and/or PCB 255. Additionally, while FIG. 2 includes an example of a particular layout of interconnects, it is to be understood that in other examples, a layout of interconnects may be of different sizes, have different physical locations, have a different number of interconnects, be located entirely in the package, be located entirely in the PCB, be located in both the package and the PCB, and/or the like.

Figure 3:
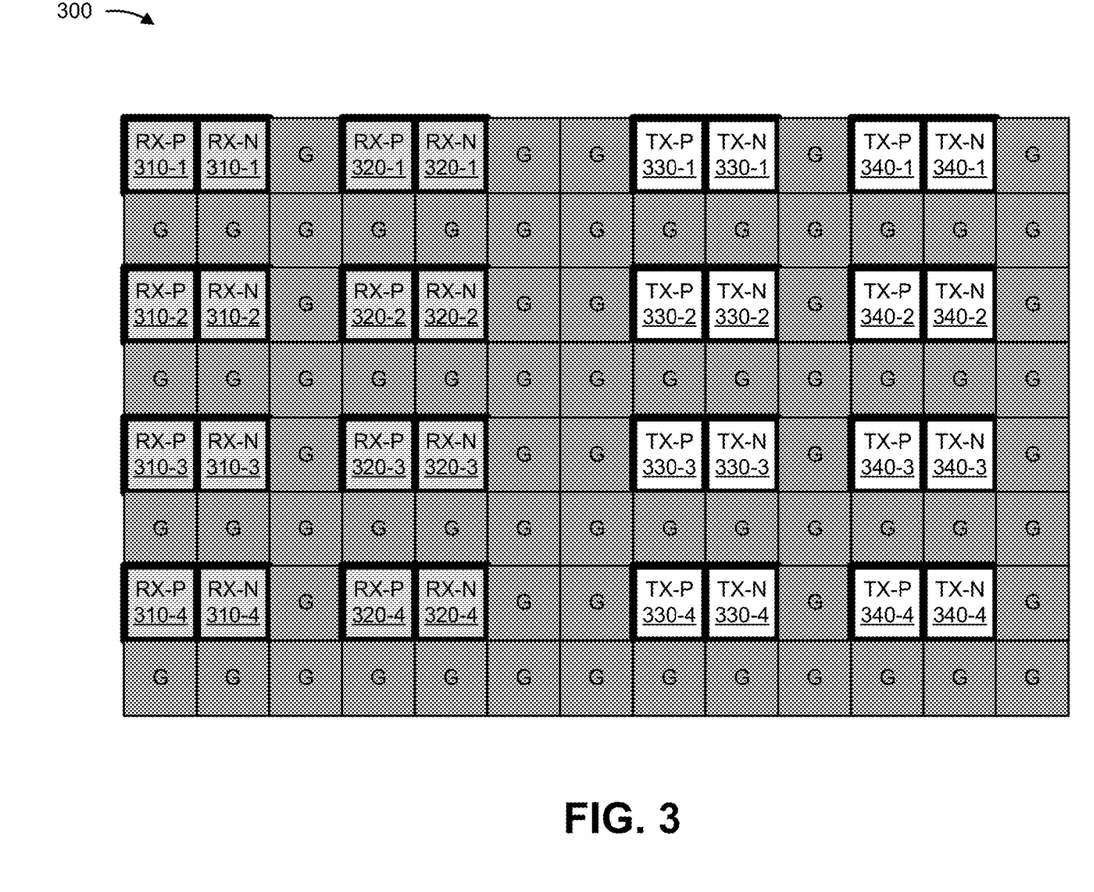
FIG. 3 is a diagram of an example grid array (GA) pin-out pattern used as part of the example PCB assembly.

FIG. 3 is an example implementation 300 of a GA pin-out pattern. For example, the example GA pin-out pattern shown in FIG. 3 may enable package 220 to mount to PCB 255 (e.g., to provide electrical connectivity for package 220 mounted to PCB 255 using solder balls 240). In other words, the example GA pin-out pattern shown in FIG. 3 may correspond to a pattern of an array of PCB vias 260 of PCB 255. Additionally, or alternatively, the example GA pin-out pattern shown in FIG. 3 may enable package 220 to mount to component 205 (e.g., to provide electrical connectivity for package 220 mounted to component 205 using solder bumps 215). In other words, the example GA pin-out pattern shown in FIG. 3 may correspond to a pattern of any array of package vias 235 of package 220.

As shown in FIG. 3, the GA pin-out pattern may include differential TX pin pairs for transmission of signals output by component 205, and differential RX pin pairs for reception of signals to be received by component 205.

In some implementations, different differential pin pairs may provide and/or receive signals using different package vias 235 and/or PCB vias 260. Additionally, or alternatively, different package vias 235 may extend to different layers of package 220 and/or different PCB vias 260 may extend to different layers of PCB 255 as described in connection with FIG. 2. For example, a first group of differential RX pin pairs (shown as RX pin pair 310-1, 310-2, 310-3, and 310-4) may correspond to PCB vias 260 that extend to a first layer of PCB 255 (e.g., layer 3, layer 5, layer 9, etc.), and a second group of differential RX pin pairs (shown as RX pin pair 320-1, 320-2, 320-3, and 320-4) may correspond to PCB vias 260 that extend to a second layer of PCB 255 (e.g., layer 9, layer 5, layer 3, etc.). That is, various differential RX pin pairs may receive signals using different PCB vias 260.

Additionally, or alternatively, a first group of differential TX pin pairs (shown as TX pin pair 330-1, 330-2, 330-3, and 330-4) may correspond to PCB vias 260 that extend to a layer of PCB 255 (e.g., layer 9, layer 5, layer 3, etc.), and/or a second group of differential TX pin pairs (shown as TX pin pair 340-1, 340-2, 340-3, and 340-3) may correspond to PCB vias 260 that extend to a fourth layer of PCB 255 (e.g., layer 3, layer 5, layer 9, etc.). That is, various differential TX pin pairs may transmit signals using different PCB vias 260.

In some implementations, the GA pin-out pattern shown in FIG. 3 may be used to support high-speed differential signals that are at least 56 megabytes per second (Mbps). For example, for 56 Mbps differential signals, the GA pin-out pattern may have a ground via between each TX differential signal pair that is near another TX differential signal pair. Additionally, the GA pin-out pattern may have a ground via between each TX differential signal pair that is near another differential signal pair. Additionally, the GA pin-out pattern may have a ground via between each RX differential signal pair that is near another RX differential signal pair. Additionally, the GA pin-out pattern may have a ground via between a TX differential signal pair that is near an RX differential signal pair.

As another example, for 112 Mbps differential signals, the GA pin-out pattern may have a ground via between each TX differential signal pair that is near another TX differential signal pair. Additionally, the GA pin-out pattern may have a ground via between each RX differential signal pair that is near another RX differential signal pair. Additionally, the GA pin-out pattern may have two ground vias between a TX differential signal pair that is near an RX differential signal pair.

As another example, for 224 Mbps differential signals, the GA pin-out pattern may have two ground vias between each TX differential signal pair that is near another TX differential signal pair. Additionally, the GA pin-out pattern may have two ground vias between each RX differential signal pair that is near another RX differential signal pair. Additionally, the GA pin-out pattern may have three ground vias between a TX differential signal pair that is near an RX differential signal pair.

This GA pin-out pattern allows for more cross-sectional bandwidth of package 220 and/or PCB 255 than a GA pin-out pattern for a PCB assembly that is unable to rely on the GA space design pattern to enable FEXT cancellation. For example, without the GA space design pattern to enable FEXT cancellation, the GA pin-out pattern would only be able to support high-speed differential signals that are 112 Mbps if the GA pin-out pattern included two ground layers between each TX differential signal pair that is near another TX differential signal pair, two ground layers between each RX differential signal pair that is near another RX differential signal pair, and three ground layers between a TX differential signal pair that is near an RX differential signal pair. In this way, the GA space design pattern is able to improve cross-sectional bandwidth of package 220 and/or PCB 255 relative to conventional GA schemes that are unable to achieve FEXT cancellation.

While FIG. 3 depicts a particular GA pin-out pattern, it should be understood that other implementations include other GA pin-out patterns. Additionally, while implementations herein describe differential pin pairs corresponding to PCB vias 260 that extend to particular layers of PCB 255, other implementations include differential pin pairs that extend to other layers of PCB 255.

In this way, the GA space design pattern enables FEXT cancellation to reduce or eliminate FEXT. Additionally, the GA space design pattern improves cross-sectional bandwidth of the PCB and/or the package, increases signal density, and/or improves throughput of the PCB assembly by reducing a number of ground vias that need to be placed between vias that support actual traffic to and from the component.

The foregoing disclosure provides illustration and description, but is not intended to be exhaustive or to limit the implementations to the precise form disclosed. Modifications and variations are possible in light of the above disclosure or may be acquired from practice of the implementations.

As used herein, the term component is intended to be broadly construed as hardware, firmware, and/or a combination of hardware and software.

It will be apparent that systems and/or methods, described herein, may be implemented in different forms of hardware, firmware, or a combination of hardware and software. The actual specialized control hardware or software code used to implement these systems and/or methods is not limiting of the implementations. Thus, the operation and behavior of the systems and/or methods were described herein without reference to specific software code—it being understood that software and hardware can be designed to implement the systems and/or methods based on the description herein.

Even though particular combinations of features are recited in the claims and/or disclosed in the specification, these combinations are not intended to limit the disclosure of possible implementations. In fact, many of these features may be combined in ways not specifically recited in the claims and/or disclosed in the specification. Although each dependent claim listed below may directly depend on only one claim, the disclosure of possible implementations includes each dependent claim in combination with every other claim in the claim set.

No element, act, or instruction used herein should be construed as critical or essential unless explicitly described as such. Also, as used herein, the articles "a" and "an" are intended to include one or more items, and may be used interchangeably with "one or more." Furthermore, as used herein, the term "set" is intended to include one or more items (e.g., related items, unrelated items, a combination of related and unrelated items, etc.), and may be used interchangeably with "one or more." Where only one item is intended, the term "one" or similar language is used. Also, as used herein, the terms "has," "have," "having," or the like are intended to be open-ended terms. Further, the phrase "based on" is intended to mean "based, at least in part, on" unless explicitly stated otherwise.

What is claimed is:

1. A printed circuit board (PCB), comprising: a set of pads associated with facilitating a connection through a package and to a component, wherein the set of pads include a set of via pads and a set of grid array (GA) pads; a set of vias electrically connected to the set of via pads and to a set of layers that are perpendicular to the set of vias, wherein the set of vias are to be used to support differential signal pairs and are connected to one or more non-ground layers of the set of layers, wherein the differential signal pairs include a first differential signal pair that includes: a first differential signal that causes crosstalk onto a particular differential signal, of a second differential signal pair, while propagating through the package, and a second differential signal; and a set of interconnects that electrically connect the set of via pads to the set of GA pads, wherein the set of interconnects include: a first interconnect to route the first differential signal away from the particular differential signal of the second differential signal pair, and a second interconnect to route the second differential signal toward the particular differential signal, wherein the routed second differential signal causes an amount of crosstalk onto the particular differential signal that is proportional to an amount of crosstalk that the first differential signal causes within the package, and wherein one or more differences in length of the first interconnect with respect to the second interconnect are used to offset one or more differences in a velocity of propagation and cause delay matching of the first and second differential signals.

2. The PCB of claim 1:
wherein a length of the first interconnect and a length of the second interconnect enable the first differential signal and the second differential signal to be delay matched while propagating through the package and the PCB.

3. The PCB of claim 1:
wherein a distance that the first differential signal is to propagate through a package via, of a set of package vias, is a first distance,
wherein another distance that the second differential signal is to propagate through a first PCB via, of the set of PCB vias, is a second distance, and
wherein a length of the first interconnect and a length of the second interconnect is to offset a difference between the first distance and the second distance to enable the first differential signal and the second differential signal to be delay matched.

4. The PCB of claim 1:
wherein a length of the first interconnect and a length of the second interconnect are used to offset differences in a velocity of propagation of the first differential signal and a velocity of propagation of the second differential signal while traveling through a second non-ground layer within the PCB,
wherein the lengths of the first interconnect and the second interconnect cause the first differential signal and the second differential signal to be delay matched while traveling through the package and the PCB.

5. The PCB of claim 1:
wherein a length of the first interconnect or a length of the second interconnect are used to delay match the first differential signal and the second differential signal based on a difference in a diameter of vias used to propagate the first differential signal and the second differential signal.

6. The PCB of claim 1:
wherein the first interconnect and the second interconnect enable crosstalk cancellation as applied to the particular differential signal,
wherein the set of vias includes a set of ground vias that is connected to one or more ground layers of the set of layers, and wherein a total number of vias, in the set of vias, that are to be used as the set of ground vias, is less than a number of vias that would be used as the set of ground vias if the first interconnect and the second interconnect did not enable crosstalk cancellation.

7. The PCB of claim 1:
wherein the set of vias includes a set of ground vias that is connected to one or more ground layers of the set of layers,
wherein the differential signal pairs that are to be supported by the set of vias are at least 56 gigabytes per second (Gbps) signals, and
wherein each non-ground via, of the set of vias, is adjacent to one ground via, of the set of ground vias.

8. A printed circuit board (PCB) assembly, comprising: a component that sends or receives differential signal pairs; a package that is connected to the component; and a PCB connected to the package, wherein a set of pads are connected to the package or to the PCB to facilitate a connection between the PCB and the component, wherein the set of pads include a set of package via pads, a set of package grid array (GA) pads, a set of PCB via pads, and a set of PCB GA pads, wherein the set of package via pads are connected to a set of package vias, wherein the set of PCB pads are connected to a set of PCB vias, wherein the set of package vias and the set of PCB vias are to be used to support differential signal pairs that include a first differential signal pair, wherein the first differential signal pair includes: a first differential signal that causes crosstalk onto a particular differential signal, of a second differential signal pair, while propagating through a particular package via, of the set of package vias, and a second differential signal; wherein a set of interconnects are used to connect package pads to package GA pads or are used to connect PCB pads to PCB GA pads, wherein the set of interconnects includes: a first interconnect to route the first differential signal away from the particular differential signal, and a second interconnect to route the second differential signal toward the particular differential signal, and wherein one or more differences in length of the first interconnect with respect to the second interconnect are used to offset one or more differences in a velocity of propagation and cause delay matching of the first and second differential signals.

9. The PCB assembly of claim 8:
wherein the first interconnect is located on the package and the second interconnect is located on the PCB, and
wherein routing the second differential signal toward the particular differential signal enables the second differential signal to cause crosstalk onto the particular differential signal,
wherein an amount of crosstalk that the second differential signal causes is proportional to an amount of crosstalk that the first differential signal causes within the particular package via of the set of package vias.

10. The PCB assembly of claim 8:
wherein the first interconnect is located on the PCB and the second interconnect is located on the package, and
wherein routing the second differential signal toward the particular differential signal enables the second differential signal to cause crosstalk onto the particular differential signal,
wherein an amount of crosstalk that the second differential signal causes is proportional to an amount of crosstalk that the first differential signal causes within the particular package via of the set of package vias.

11. The PCB assembly of claim 8, wherein a length of the first interconnect or a length of the second interconnect enable differential signals of the first differential signal pair to be delay matched while propagating through the package and the PCB.

12. The PCB assembly of claim 8:
wherein a length of the first interconnect or a length of the second interconnect are used to delay match the first differential signal and the second differential signal based on at least one of:
a difference in a total distance that the first differential signal and the second differential signal propagate through the package in relation to a total distance that the first differential signal and the second differential signal propagate through the PCB, or
a difference in a velocity of propagation of the first differential signal and the second differential signal while propagating through the package in relation to a velocity of propagation of the first differential signal and the second differential signal while propagating through the PCB.

13. The PCB assembly of claim 8:
wherein the first interconnect and the second interconnect enable crosstalk cancellation as applied to the particular differential signal,
wherein the set of package vias and the set of PCB vias each include a set of ground vias that are connected to one or more ground layers within the package, and the PCB, respectively,
wherein a total number of package vias, in the set of package vias, that are to be used as the set of ground vias, is less than a number of package vias that would be used as the set of ground vias if the set of interconnects did not enable crosstalk cancellation, and
wherein a total number of PCB vias, in the set of PCB vias, that are to be used as the set of ground vias, is less than a number of PCB vias that would be used as the set of ground vias if the set of interconnects did not enable crosstalk cancellation.

14. A package, comprising: a set of pads associated with facilitating a connection between a printed circuit board (PCB) and one or more components, wherein the set of pads include a set of via pads and a set of grid array (GA) pads; a set of vias electrically connected to the set of via pads and to a set of layers that are perpendicular to the set of vias, wherein the set of vias are to be used to support differential signal pairs and are connected to one or more non-ground layers of the set of layers, wherein the differential signal pairs include a first differential signal pair that includes: a first differential signal that causes crosstalk onto a particular differential signal, of a second differential signal pair, while propagating through a particular via, of the set of vias, and a second differential signal; and a set of interconnects that electrically connect the set of via pads to the set of GA pads, wherein the set of interconnects includes: a first interconnect to route the first differential signal away from the particular differential signal, a second interconnect to route the second differential signal toward the particular differential signal, and wherein the first interconnect traverses through a non-ground layer and the second interconnect traverses through a different non-ground layer, and wherein one or more differences in length of the first interconnect with respect to the second interconnect are used to offset one or more differences in a velocity of propagation and cause delay matching of the first and second differential signals.

15. The package of claim 14:
wherein routing the second differential signal toward the particular differential signal enables the second differential signal to cause crosstalk onto the particular differential signal,
wherein an amount of crosstalk that the second differential signal causes is proportional to an amount of crosstalk that the first differential signal causes within the particular via of the set of vias.

16. The package of claim 14:
wherein a length of the first interconnect or a length of the second interconnect enable the first differential signal and the second differential signal to be delay matched while propagating through the package and the PCB.

17. The package of claim 14:
wherein a length of the first interconnect or a length of the second interconnect are used to delay match the first differential signal and the second differential signal based on a difference in a total distance that the first differential signal and the second differential signal propagate through the package in relation to a total distance that the first differential signal and the second differential signal propagate through the PCB.

18. The package of claim 14:
wherein a length of the first interconnect or a length of the second interconnect are used to delay match the first differential signal and the second differential signal based on a difference in a velocity of propagation of the first differential signal and the second differential signal while propagating through the package in relation to a velocity of propagation of the first differential signal and the second differential signal while propagating through the PCB.

19. The package of claim 14:
wherein a length of the first interconnect or a length of the second interconnect is used to delay match the first differential signal and the second differential signal based on a difference in a diameter of the particular via in relation to a diameter of a corresponding via in the PCB.

20. The package of claim 14:
wherein the first interconnect and the second interconnect enable crosstalk cancellation as applied to the particular differential signal,
wherein the set of vias includes a set of ground vias that is connected to one or more ground layers of the set of layers, and
wherein a total number of vias, in the set of vias, that are to be used as the set of ground vias, is less than a number of vias that would be used as the set of ground vias if the set of interconnects did not enable crosstalk cancellation.

* * * * *